United States Patent
Seo et al.

(10) Patent No.: US 10,596,780 B2
(45) Date of Patent: Mar. 24, 2020

(54) FLEXIBLE ELECTROMAGNETIC SHIELDING SHEET AND ELECTRONIC DEVICE PROVIDED WITH SAME

(71) Applicant: AMOGREENTECH CO., LTD., Gimpo-si (KR)

(72) Inventors: In Yong Seo, Seoul (KR); Ui Young Jeong, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 0 days.

(21) Appl. No.: 16/300,345

(22) PCT Filed: May 23, 2017

(86) PCT No.: PCT/KR2017/005309
§ 371 (c)(1),
(2) Date: Nov. 9, 2018

(87) PCT Pub. No.: WO2017/209427
PCT Pub. Date: Dec. 7, 2017

(65) Prior Publication Data
US 2019/0143636 A1 May 16, 2019

(30) Foreign Application Priority Data
May 30, 2016 (KR) .................. 10-2016-0066569

(51) Int. Cl.
*B32B 5/26* (2006.01)
*C09J 9/02* (2006.01)
(Continued)

(52) U.S. Cl.
CPC .................. *B32B 5/26* (2013.01); *B32B 5/02* (2013.01); *B32B 5/022* (2013.01); *B32B 7/12* (2013.01);
(Continued)

(58) Field of Classification Search
CPC ............ B32B 5/26; C09J 7/38; H05K 9/0022; H05K 9/0084; H05K 9/009
See application file for complete search history.

(56) References Cited

U.S. PATENT DOCUMENTS

2012/0111627 A1* 5/2012 Kato ...................... B32B 5/022
174/388
2015/0084825 A1* 3/2015 Lee ........................ H01Q 1/526
343/841
(Continued)

FOREIGN PATENT DOCUMENTS

JP 2015065343 4/2015
KR 20110072946 6/2011
(Continued)

OTHER PUBLICATIONS

International Search Report—PCT/KR2017/005309 dated Aug. 22, 2017.

*Primary Examiner* — William H. Mayo, III
*Assistant Examiner* — Hiram E Gonzalez
(74) *Attorney, Agent, or Firm* — Cantor Colburn LLP

(57) ABSTRACT

Provided are a flexible electromagnetic shielding sheet and an electronic device having the same. The flexible electromagnetic shielding sheet includes: a pressure-sensitive adhesive tape having an electrically conductive adhesive layer on one surface thereof; a fiber web adhered to the electroconductive adhesive layer and formed by accumulating fibers; a metal layer formed on at least one surface of the fiber web to shield electromagnetic waves; and an insulating film bonded to the fiber web on which the metal layer is formed. Further, the pressure-sensitive adhesive tape includes: a fiber-accumulating type substrate formed by accumulating a plurality of fibers and having a plurality of pores; and an electrically conductive adhesive layer formed on either surface of the fiber-accumulating type substrate,
(Continued)

and made of an electrically conductive adhesive material filled in the plurality of pores and electrically connected to the fiber-accumulating type substrate by an applied pressure.

13 Claims, 5 Drawing Sheets

(51) Int. Cl.
B32B 5/02 (2006.01)
H05K 9/00 (2006.01)
C09J 7/29 (2018.01)
C09J 7/38 (2018.01)
B32B 7/12 (2006.01)
B32B 27/12 (2006.01)
B32B 27/36 (2006.01)
D06M 11/83 (2006.01)
H05K 1/18 (2006.01)
B32B 15/14 (2006.01)

(52) U.S. Cl.
CPC ............ *B32B 15/14* (2013.01); *B32B 27/12* (2013.01); *B32B 27/36* (2013.01); *C09J 7/29* (2018.01); *C09J 7/38* (2018.01); *C09J 9/02* (2013.01); *D06M 11/83* (2013.01); *H05K 1/181* (2013.01); *H05K 9/009* (2013.01); *H05K 9/0022* (2013.01); *H05K 9/0084* (2013.01); *H05K 9/0088* (2013.01); *B32B 2250/03* (2013.01); *B32B 2255/02* (2013.01); *B32B 2255/205* (2013.01); *B32B 2255/26* (2013.01); *B32B 2260/021* (2013.01); *B32B 2260/046* (2013.01); *B32B 2262/02* (2013.01); *B32B 2262/103* (2013.01); *B32B 2307/202* (2013.01); *B32B 2307/206* (2013.01); *B32B 2307/212* (2013.01); *B32B 2405/00* (2013.01); *B32B 2457/08* (2013.01); *C08K 2201/001* (2013.01); *C09J 2201/122* (2013.01); *C09J 2201/606* (2013.01); *C09J 2203/326* (2013.01); *C09J 2205/102* (2013.01); *C09J 2400/163* (2013.01); *C09J 2400/263* (2013.01); *H05K 2201/10371* (2013.01)

(56) References Cited

U.S. PATENT DOCUMENTS

2015/0086743 A1* 3/2015 Lee ........................... C09J 9/02
428/41.8
2018/0222154 A1* 8/2018 Yamamoto ............... B32B 5/02

FOREIGN PATENT DOCUMENTS

| KR | 20120122954 | 11/2012 |
| KR | 20130136386 | 12/2013 |
| KR | 101501057 | 3/2015 |
| KR | 101511284 | 4/2015 |
| KR | 20150080436 | 7/2015 |

* cited by examiner

FLEXIBLE ELECTROMAGNETIC SHIELDING SHEET AND ELECTRONIC DEVICE PROVIDED WITH SAME

TECHNICAL FIELD

The present disclosure relates to an electromagnetic shielding sheet, and more particularly, to a flexible electromagnetic shielding sheet excellent in flexibility and capable of improving the electromagnetic shielding efficiency, and an electronic device having the flexible electromagnetic shielding sheet.

BACKGROUND ART

In recent years, electronic devices including mobile phones, tablet personal computers (PCs), notebooks, or digital cameras have achieved high-performance and high-function, and thus various components have been implemented therein.

In addition, as the demand for high-lightweight and flexible electronic devices is increased, flexible components are actively developed.

Components incorporated in such electronic devices generate heat and electromagnetic waves when performing high-performance and multi-function. When the electromagnetic waves flow into components or flow out to the outside, a variety of electromagnetic disturbances are generated due to electromagnetic waves from malfunction of other electronic devices to negative effects on the human body.

Therefore, an electromagnetic shielding sheet is essentially used for an electronic device to prevent the electromagnetic waves from affecting the components.

Electromagnetic shielding technology can be divided into a method of shielding external devices by shielding the vicinity of an electromagnetic wave generating source and a method of protecting an electronic device inside a shielding material and protecting the electronic device from an external electromagnetic wave generating source.

At present, various technologies for enhancing electromagnetic shielding are continuously being developed, and it is necessary to develop a technology of an electromagnetic shielding sheet to be adhered or bonded to an electromagnetic wave generating source and to be connected to the ground.

Korean Patent Application Publication No. 2013-0136386 (Patent Document 1) discloses an electromagnetic shielding sheet including: a substrate which is produced into a nanoweb form by spinning a polymer material into a fiber strand by a spinning method; a conductive metal layer formed on one surface of the substrate and shielding electromagnetic waves; and an adhesive layer formed on the other surface of the substrate.

The adhesive layer of the electromagnetic shielding sheet of Patent Document 1 is formed by accumulating a plurality of fiber strands obtained by spinning an adhesive material. The adhesive layer has only an adhesive function for adhering the electromagnetic shielding sheet to an object. The electromagnetic shielding function cannot be performed due to electrical energization when the electromagnetic shielding sheet is adhered to an object.

DISCLOSURE

Technical Problem

The present disclosure has been made in view of the above-mentioned problems, and it is an object of the present disclosure to provide a flexible electromagnetic shielding sheet capable of increasing the electromagnetic shielding efficiency by surrounding and packaging an electromagnetic wave generating unit with excellent flexibility, and an electronic device having the flexible electromagnetic shielding sheet.

It is another object of the present disclosure to provide a flexible electromagnetic shielding sheet capable of improving the electromagnetic shielding efficiency by increasing an electrical energization capability and an electronic device having the same.

It is another object of the present disclosure to provide a flexible electromagnetic shielding sheet which can be energized in an electrically conductive adhesive layer of a pressure-sensitive adhesive tape by an applied pressure when packaging an electromagnetic wave generating unit with an electromagnetic shielding sheet wrapped thereon and an electronic device having the flexible electromagnetic shielding sheet.

Technical Solution

In order to achieve the above object, a flexible electromagnetic shielding sheet according to an embodiment of the present invention comprises: a pressure-sensitive adhesive tape having an electrically conductive adhesive layer on one surface; a fiber web adhered to the electrically conductive adhesive layer and formed by accumulating fibers; a metal layer formed on at least one surface of the fiber web to shield electromagnetic waves; and an insulation film adhered to the fiber web on which the metal layer is formed, wherein the pressure-sensitive adhesive tape comprises: a fiber-accumulating type substrate formed by accumulating a plurality of fibers and having a plurality of pores; and the electrically conductive adhesive layer formed on either side of the fiber-accumulating substrate and made of an electrically conductive adhesive material filled in the plurality of pores, to be electrically connected to fiber-accumulating type substrate by an applied pressure.

The fiber web may be a non-porous structure or a microporous structure.

In addition, the metal layer may be formed on one or both sides of the fiber web of the non-porous structure.

In addition, the metal layer may be formed in an ultra-thin film form on one or both surfaces of the fiber web of the micropore structure, or the metal layer may be formed with an ultra-thin film metal layer which is formed by coating a metal on inner side walls of micropores of the fiber web of the micropore structure (i.e., outer circumferential surfaces of the fibers) and formed on one or both sides of the fiber web.

In addition, the insulation film may be a flexible insulating film or a nanofiber web sheet formed by accumulating nanofibers.

Further, the electrically conductive adhesive layer of the pressure-sensitive adhesive tape and the metal layer may be connected to the ground.

In addition, the pressure-sensitive adhesive tape may be packaged so as to surround an electromagnetic wave generating unit mounted on a printed circuit board.

In addition, the fiber-accumulating type substrate may be a nanofiber web made of fibers having a diameter of 1 μm or less or a nonwoven web made of fibers having a diameter of more than 1 μm.

The fiber-accumulating type substrate has a structure in which a nanofiber web composed of fibers having a diameter of 1 μm or less is bonded to one surface or both surfaces of a nonwoven fabric web made of fibers having a diameter of more than 1 μm. The nanofiber web may be formed by accumulating fibers of a polymer material obtained by electrospinning on one surface or both surfaces of the nonwoven fabric web, or may be formed by laminating a separately formed nanofiber web on one surface or both surfaces of the nonwoven fabric web.

In addition, the diameters of the fibers may be 100 nm to 5 μm.

Meanwhile, the plurality of fibers forming the fiber-accumulating type substrate may include: a first metal coating layer of Ni coated on outer circumferential surfaces of the fibers; and a second metal coating layer of Cu coated on an outer circumferential surface of the first metal coating layer of Ni.

The electrically conductive adhesive layer may be made of an adhesive material in which an electrically conductive filler is dispersed.

The sum of the thickness of the fiber-accumulating substrate on which the metal coating layer is formed and the thickness of the electrically conductive adhesive layer, that is, the thickness of the pressure-sensitive adhesive tape may be 30 μm or less.

The electronic device according to an embodiment of the present invention may be configured such that the pressure-sensitive adhesive tape of the above-described flexible electromagnetic shielding sheet encapsulates the electromagnetic wave generating unit.

An electronic device according to an embodiment of the present invention includes: a printed circuit board; an electromagnetic wave generating unit mounted on the printed circuit board; and a flexible electromagnetic shielding sheet which surrounds the electromagnetic wave generating unit and is coupled to or bonded to the printed circuit board to shield electromagnetic waves generated from the electromagnetic wave generating unit and electromagnetic waves flowing into the electromagnetic wave generating unit from the outside, wherein the flexible electromagnetic shielding sheet comprises: a pressure-sensitive adhesive tape comprising a fiber-accumulating type substrate formed by accumulating a plurality of fibers and having a plurality of pores, and an electrically conductive adhesive layer formed on either side of the fiber-accumulating substrate and made of an electrically conductive adhesive material filled in the plurality of pores, to be electrically connected to the fiber-accumulating type substrate by an applied pressure; a metal layer which is adhered to the electrically conductive adhesive layer on one surface of the pressure-sensitive adhesive tape to shield the electromagnetic waves; and an insulating layer formed on the metal layer.

Further, the electrically conductive adhesive layer of the pressure-sensitive adhesive tape and the metal layer may be connected to the ground.

Advantageous Effects

According to the present disclosure, it is possible to produce a tape-shaped electromagnetic shielding sheet excellent in warping characteristics by using a pressure-sensitive adhesive tape based on a fiber-accumulating type substrate, a fiber web, an ultrathin metal layer and an insulating film.

That is, according to the present disclosure, there is an advantage that the electromagnetic shielding sheet having excellent flexibility can wrap and package an electromagnetic wave generating unit to increase electromagnetic wave shielding efficiency. In addition, there is an advantage that the electromagnetic shielding sheet can be installed at a bent position in which it is difficult to mount the electromagnetic shielding sheet due to various obstacles and at a position where a warp is required.

According to the present disclosure, the flexible electromagnetic shielding sheet includes the pressure-sensitive adhesive tape having pores in the fiber-accumulating type substrate excellent in electrical conductivity and an electrically conductive adhesive layer formed on the surface of the fiber-accumulating type substrate. As a result, when the electromagnetic shielding sheet wraps and packages the electromagnetic wave generating unit, the electric conductive adhesive layer is energized by the applied pressure, and thus the electromagnetic wave shielding efficiency can be improved due to an increase in an electrical energization capacity.

BEST MODE

Hereinafter, embodiments of the present invention will be described in detail with reference to the accompanying drawings.

Figure 1:
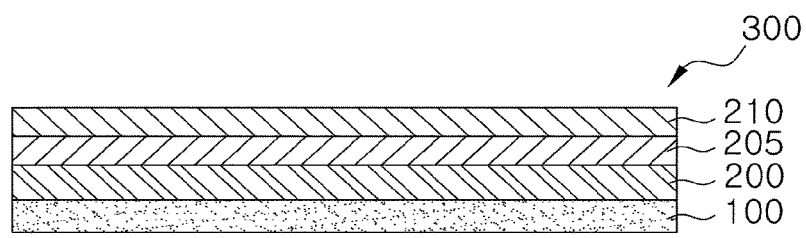
FIG. 1 is a cross-sectional view of a flexible electromagnetic shielding sheet according to an embodiment of the present invention.
Figure 3:
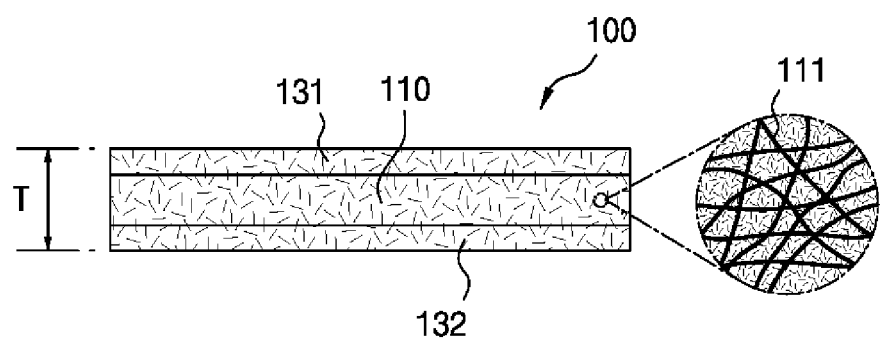
FIG. 3 is a cross-sectional view of a pressure-sensitive adhesive tape according to an embodiment of the present invention.

Referring to FIGS. 1 and 3, a flexible electromagnetic shielding sheet 300 according to an embodiment of the present invention includes: a pressure-sensitive adhesive tape 100 including a fiber-accumulating type substrate 110 which is formed by accumulating a plurality of fibers 111 and having a plurality of pores and which is formed by coating metal on outer circumferential surfaces of the plurality of fibers, and electrically conductive adhesive layers 131 and 132 formed on both surfaces of the fiber-accumulating type substrate 110 and made of an electrically conductive adhesive material filled in the plurality of pores and electrically connected to the fiber-accumulating type substrate 110 by an applied pressure; a fiber web 200 adhered to the electroconductive adhesive layer 131 on one surface of the pressure-sensitive adhesive tape 100 and having fibers accumulated therein; a metal layer 205 formed on the fiber web 200 to shield electromagnetic waves; and an insulating film 210 bonded to the fiber web 200 on which the metal layer 205 is formed.

Here, the fiber web 200 may be a non-porous structure or a microporous structure.

The metal layer 205 may be formed on one or both surfaces of the fiber web 200 having a non-porous structure. Here, the metal layer 205 is formed as an ultra-thin film on one or both surfaces of the fiber web 200 having a micropore structure, or the metal layer is implemented as an ultra-thin film metal layer formed by coating metal on the inner side walls of the mircopores of the fiber web 200 (that is, the outer circumferential surfaces of the fibers), and formed on one or both sides of the fiber web 200.

The metal layer 205 is formed by a sputtering process or by electroless plating.

A flexible insulating film such as a polyethylene terephthalate (PET) film or a nanofiber web sheet formed by accumulating nanofibers may be used as the insulating film 210.

Accordingly, according to an embodiment of the present invention, a tape-shaped electromagnetic shielding sheet 300 having excellent flexibility can be manufactured by using a pressure-sensitive adhesive tape 100 including a fiber-accumulating type substrate 110, a fiber web 200 on which a metal layer 205 is coated, and an insulation film 210.

Figure 2:
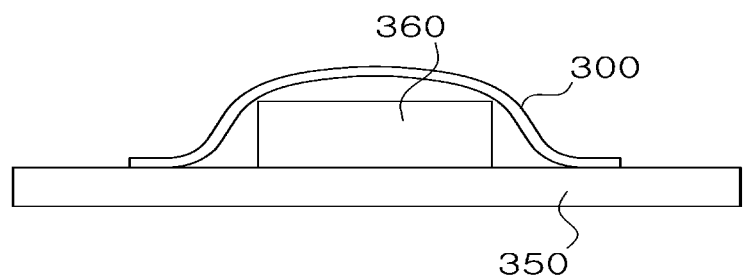
FIG. 2 is a schematic cross-sectional view of an electronic device provided with a flexible electromagnetic shielding sheet according to an embodiment of the present invention.

Referring to FIG. 2, the flexible electromagnetic shielding sheet 300 according to an embodiment of the present invention is excellent in bending characteristics (i.e., flexibility) and can be packaged to completely enclose an electromagnetic wave generating unit 360 of an electronic device. Thus, there is an advantage of improving electromagnetic wave shielding efficiency.

That is, when the electronic device includes a printed circuit board 350; and an electromagnetic wave generating unit 360 such as an application processor (AP) chip mounted on the printed circuit board 350, the electromagnetic wave generating unit 360 is wrapped with the flexible electromagnetic shielding sheet 300 according to an embodiment of the present invention and then is combined with (or adhered to) the printed circuit board 350 for package.

Here, when the metal layer 205 of the flexible electromagnetic shielding sheet 300 and the electrically conductive adhesive layers 131 and 132 of the pressure-sensitive adhesive tape 100 are connected to the ground, the electromagnetic waves flowing in the pressure-sensitive adhesive tape 100 exits via the ground and the electromagnetic waves transmitted to the metal layer 205 also escapes to the ground.

As described above, the pressure-sensitive adhesive tape 100 of the flexible electromagnetic shielding sheet can shield the electromagnetic waves generated in the electromagnetic wave generating unit 360 or can shield the electromagnetic waves that flow into the electromagnetic wave generating unit 360 from the outside.

In addition, according to an embodiment of the present invention, the flexible electromagnetic shielding sheet 300 includes the pressure-sensitive adhesive tape 100 in which the electrically conductive adhesive layers 131 and 132 are formed on the pores and the surfaces in the fiber-accumulating type substrate 110 having excellent electrical conductivity, there is an advantage that the electromagnetic wave shielding efficiency can be improved by the excellent electric energization ability.

Therefore, the electromagnetic waves emitted from the electromagnetic generating unit 360 is shielded by the flexible electromagnetic shielding sheet 300 and is not leaked to the outside, and the electromagnetic waves introduced from the outside is also shielded by the flexible electromagnetic shielding sheet 300, to thereby increase the electromagnetic wave shielding performance.

Therefore, according to an embodiment of the present invention, the shielding efficiency can be increased by covering the electromagnetic wave generating unit 360 with the electromagnetic shielding sheet 300, and there is also an advantage that the electromagnetic shielding sheet 300 can be installed even at a bent position in which it is difficult to mount the electromagnetic shielding sheet due to various obstacles and at a position where a warp is required.

Technical characteristics of the pressure-sensitive adhesive tape applied to the flexible electromagnetic shielding sheet according to an embodiment of the present invention will be described below.

Referring to FIG. 3, a pressure-sensitive adhesive tape 100 according to an embodiment of the present invention includes a fiber-accumulating type substrate 110 having a plurality of fibers 111 accumulated therein and forming a plurality of pores between the plurality of fibers 111; a metal coating layer (not shown) coated on the outer circumferential surfaces of the plurality of fibers 111 of the fiber-accumulating type substrate 110 to reduce the sizes of the plurality of pores; and electrically conductive adhesive layers 131 and 132 formed on one or both surfaces of the fiber-accumulating type substrate 110 on which the metal coating layer is formed and made of an electrically conductive adhesive material filled in a plurality of pores reduced in size by the metal coating layer, and electrically connected to the fiber-accumulating type substrate 110 by an applied pressure.

The fiber-accumulating type substrate 110 is a fiber web sheet formed by accumulating fibers 111, and the fiber web sheet typically includes a nanofiber web formed of fibers of relatively small diameters of 1 μm or less or a nonwoven fabric web formed of fibers of relatively large diameters greater than 1 μm.

The fiber-accumulating type substrate 110 is formed by accumulating fibers 111 obtained by electrospinning a polymer material. Here, the fibers obtained by electrospinning are dropped and accumulated, and a large number of pores are formed between the fibers.

The metal coating layer is a coating layer of a metal material having excellent electrical conductivity, and Ni, Cu, etc. may be used as the metal. The metal coating layer can be formed by an electroless plating method.

The electrically conductive adhesive layers 131 and 132 are implemented with an adhesive material in which an electrically conductive filler 136 (see FIG. 4A) is dispersed, and The electrically conductive filler 136 uses at least one of metal powder such as Ni, Cu, and Ag, which is excellent in electrical conductivity, carbon black powder, carbon nanotube powder, and graphene powder.

In some embodiments of the present invention, a metal coating layer is formed on the outer circumferential surfaces of a plurality of fibers 111 of the fiber-accumulating type substrate 110 to implement the fiber-accumulating type substrate 110 with excellent electrical conductivity and improved flexibility.

In the pressure-sensitive adhesive tape 100 according to an embodiment of the present invention, since the electrically conductive adhesive layers 131 and 132 are formed on the pores and the surface in the fiber-accumulating type substrate 110 having excellent electrical conductivity, As the electric conductive adhesive layers 131 and 132 are energized by a pressure applied when the pressure-sensitive adhesive tape 100 is pressed and adhered to an object, there is an advantage that the electrical energization ability is increased thereby increasing the electromagnetic wave shielding performance.

In addition, in some embodiments of the present invention, a sum (T) of the thickness of the fiber-accumulating type substrate 110 on which the metal coating layer is formed and the thicknesses of the electrically conductive adhesive layers 131 and 132 is preferably 30 µm or less. That is, the pressure-sensitive adhesive tape 100 can be realized as an ultra-thin structure having a thickness of 30 µm or less, there is an advantage that the electromagnetic waves generated in the electromagnetic wave generating unit 360 of the electronic device can be effectively shielded by satisfying the specification of the electronic device including the latest portable terminal.

In the pressure-sensitive adhesive tape 100 according to an embodiment of the present invention, the metal coating layer is coated on the outer circumferential surfaces of the plurality of fibers 111 of the fiber-accumulating type substrate 110. Accordingly, the electrically conductive adhesive layers 131 and 132 are formed on one or both surfaces of the fiber-accumulating type substrate 110 in a state where the fiber-accumulating type substrate 110 has electrical conductivity. The plurality of pores of the fiber-accumulating type substrate 110 are filled with the electrically conductive adhesive layers 131 and 132, thereby being capable of being electrically energized by applying pressure, thus having an electromagnetic wave shielding function.

Figure 4A:
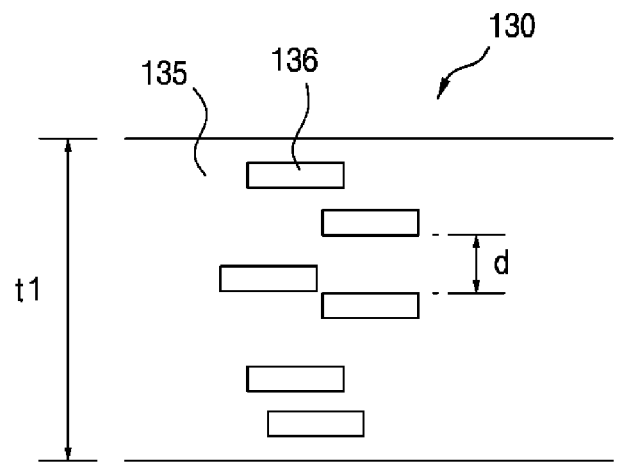
FIGS. 4A and 4B are schematic diagrams for explaining the states before and after pressing of an electrically conductive adhesive layer of a pressure-sensitive adhesive tape according to an embodiment of the present invention.
Figure 4B:
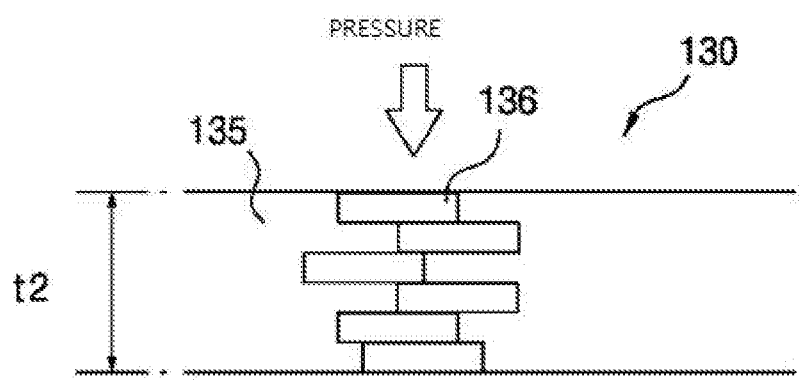

FIGS. 4A and 4B are schematic diagrams for explaining the states before and after pressing of an electrically conductive adhesive layer of a pressure-sensitive adhesive tape according to an embodiment of the present invention. As shown in FIG. 4A, before the pressure is applied to the pressure-sensitive adhesive tape 100, a plurality of electrically conductive fillers 136 dispersed in the adhesive material layer 135 of the electrically conductive adhesive layer 130 included in the pressure-sensitive adhesive tape 100 are spaced apart from each other by a predetermined distance d. As shown in FIG. 4B, in the case that the pressure is applied to the pressure-sensitive adhesive tape 100 to thus make the pressure-sensitive adhesive tape 100 adhered to a target object, the plurality of electrically conductive fillers 136 dispersed in the adhesive material layer 135 of the electrically conductive adhesive layer 130 are pressed by the pressure to contact each other to then be electrically connected with each other.

Here, when the pressure-sensitive adhesive tape 100 is electrically connected to a target object and connected to the ground, the electromagnetic waves generated by the electromagnetic wave generating unit 360 are absorbed by the pressure-sensitive adhesive tape 100 and emitted through the ground so as to be electrically shielded.

FIGS. 4A and 4B schematically exaggeratedly illustrate the characteristics of the electrically conductive pressure-sensitive adhesive layer 130 included in the pressure-sensitive adhesive tape 100 according to an embodiment of the present invention. In conception, the thickness t2 of the electrically conductive pressure-sensitive adhesive layer 130 after the pressure is applied is slightly reduced into the thickness t1 of the electrically conductive pressure-sensitive adhesive layer 130 before the pressure is applied.

Figure 5A:
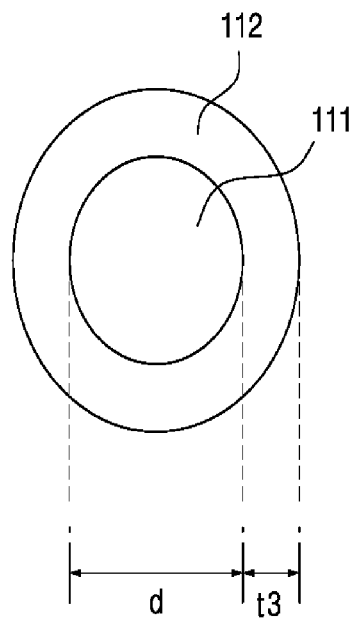
FIGS. 5A and 5B are schematic sectional views for explaining the states in which a metal coating layer is formed on fibers of a fiber-accumulating type substrate of a pressure-sensitive adhesive tape according to embodiments of the present invention.
Figure 5B:
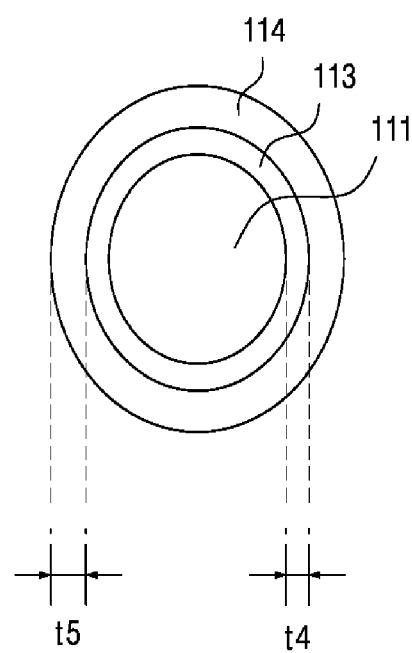

Referring to FIGS. 5A and 5B, a metal coating layer 112 or metal coating layers 113 and 114 are formed on the outer circumferential surface of the fiber 111 forming the fiber-accumulating type substrate 110 shown in FIG. 3.

Here, fibers of a polymer material are accumulated to form the fiber-accumulating type substrate 110 having electrical insulation characteristics. However, the fiber-accumulating type substrate 110 having the metal coating layer 112 or the metal coating layers 113 and 114 formed on the outer circumferential surface of the fiber 111 has electrical conductivity.

As shown in FIG. 5A, a single-layered metal coating layer 112 may be formed on the outer circumferential surface of the fiber 111. Otherwise, as shown in FIG. 5A, two-layered first and second metal coating layers 113 and 114 may be formed on the outer circumferential surface of the fiber 111.

Referring to FIG. 5B, the first and second metal coating layers 113 and 114 of the two layers are formed to increase the coating property and the electrical conductivity of the fibers 111. First, the first metal coating layer 113 of Ni, such as a seed, can be coated on the outer circumferential surface of the fiber 111, and then the second metal coating layer 114 of Cu which is excellent in electrical conductivity can be coated on the outer circumferential surface of the first metal coating layer 113 of Ni.

The thickness t4 of the first metal coating layer 113 of Ni may be preferably smaller than the thickness t5 of the second metal coating layer 114 of Cu and the thickness t3 of the metal coating layer 112 of the single layer and the thickness t4+t5 of the first and second metal coating layers 113 and 114 of the two layers are preferably in the range of 200 nm to 100 nm.

In some embodiments of the present invention, the metal coating layer may be implemented in a multiple-layer structure including: the first metal coating layer 113 of Ni coated on the outer circumferential surface of the fiber 111; and the second metal coating layer 114 of Cu coated on the outer circumferential surface of the first metal coating layer 113 of Ni.

On the one hand, it is preferable that the metal coating layer 112 of the single layer should be formed on the outer circumferential surface of the fiber 111 by electroless plating, or the first metal coating layer 113 of Ni should be coated on the outer by circumferential surface of the fiber 111 by electroless plating. On the other hand, it is preferable that the second metal coating layer 114 of Cu having excellent electrical conductivity should be coated on the outer circumferential surface of the first metal coating layer 113 of Ni by electrolytic plating.

It is preferable that the diameter d of the fibers 111 of the fiber-accumulating substrate should be in the range of 100 nm to 5 µm.

Figure 6A:
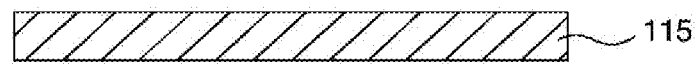
FIGS. 6A to 6C are cross-sectional views showing modifications of a fiber-accumulating type substrate of a pressure-sensitive adhesive tape according to embodiments of the present invention.
Figure 6B:
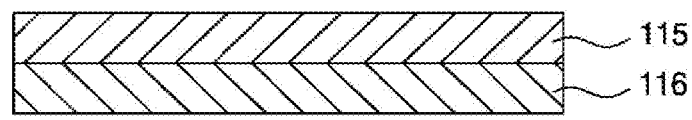
Figure 6C:
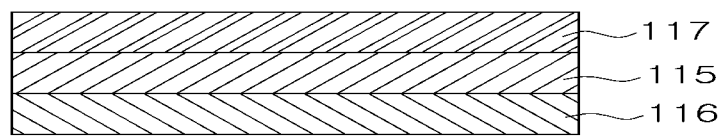

Referring to FIGS. 6A to 6C, the fiber-accumulating type substrate 110 (see FIG. 3) may include a nanofiber web made of fibers of a relatively small-diameter of 1 µm or less, or a nonwoven fabric web 115 made of fibers of a relatively large-diameter exceeding 1 µm, alone (FIG. 6A).

In order to improve the strength of the fiber-accumulating type substrate 110 and to reduce the manufacturing cost thereof, a first nanofiber web 116 formed by accumulating fibers of a polymer material obtained by electrospinning, may be bonded on one surface (FIG. 6B) of a nonwoven fabric web 115 made of fibers of a relatively large-diameter exceeding 1 µm, or first and second nanofiber webs 116 and 117 formed by accumulating fibers of a polymer material obtained by electrospinning, may be respectively bonded on both surfaces (FIG. 6C) of the nonwoven fabric web 115 made of fibers of the relatively large-diameter exceeding 1 μm, or the first nanofiber web 116 made separately may be bonded on one surface (FIG. 6B) of the nonwoven fabric web 115 or first and second nanofiber webs 116 and 117 made separately may be respectively bonded on both surfaces (FIG. 6C) of the nonwoven fabric web 115, thereby forming a laminated structure.

Figure 7:
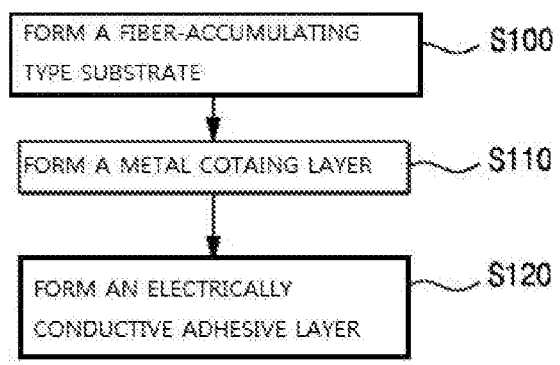
FIG. 7 is a flowchart of a method of producing a pressure-sensitive adhesive tape according to an embodiment of the present invention.

Referring to FIGS. 3 and 7, a method of manufacturing a pressure-sensitive adhesive tape according to an embodiment of the present invention will be described below. First, a plurality of fibers 111 are accumulated to form a fiber-accumulating type substrate 110 in which a plurality of pores are formed between the plurality of fibers (S100).

Thereafter, a metal is coated on the outer circumferential surfaces of the plurality of fibers 111 of the fiber-accumulating type substrate 110 to thus form a metal coating layer to reduce the size of the plurality of pores (S110).

Then, an electrically conductive adhesive material is filled into a plurality of pores of the fiber-accumulating type substrate 110 on which the metal coating layer is formed, and is formed on one or both surfaces of the fiber-accumulating type substrate 110, to thereby form the electrically conductive adhesive layers 131 and 132 which can be electrically connected by an applied pressure (S120).

Such an electrically conductive adhesive layer can be formed by a method of dip coating, laminating and electrospinning or electrospraying.

Figure 8A:
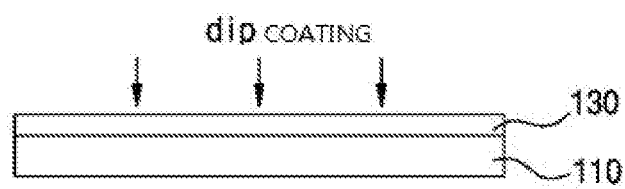
FIGS. 8A to 8C are schematic cross-sectional views for explaining a method of forming an electrically conductive adhesive layer on a fiber-accumulating type substrate of a pressure-sensitive adhesive tape according to embodiments of the present invention.

That is, as shown in FIG. 8A, an electrically conductive adhesive material is dip coated on a fiber-accumulating type substrate 110 having a metal coating layer formed thereon to thereby form an electrically conductive adhesive material 130.

Figure 8B:
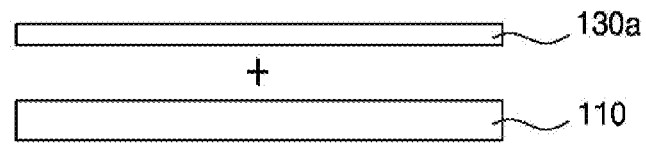

In the laminating method, an electrically conductive adhesive sheet 130a made separately from a fiber-accumulating type substrate 110 on which a metal coating layer is formed is laminated on the fiber-accumulating type substrate 110 on which the metal coating layer is formed (FIG. 8B).

Figure 8C:
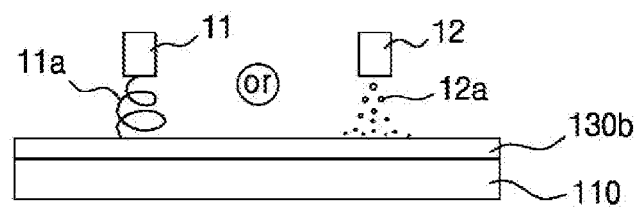

As shown in FIG. 8C, fibers 11a or droplets 12a of an electrically conductive adhesive material is electrospun or electrosprayed through a nozzle 11 or 12 from a spinning solution or a spraying solution containing a mixture of an electrically conductive adhesive material and a solvent, are accumulated on a fiber-accumulating type substrate 110 on which a metal coating layer is formed, to thereby form an electrically conductive adhesive layer 130b.

While the present invention has been particularly shown and described with reference to exemplary embodiments thereof, by way of illustration and example only, it is clearly understood that the exemplary embodiments are not to be construed as limiting the present invention, and various changes and modifications may be made by those skilled in the art within the protective scope of the invention without departing off the spirit of the present invention.

INDUSTRIAL APPLICABILITY

The present invention can be applied to a flexible electromagnetic shielding sheet excellent in flexibility and capable of improving electromagnetic wave shielding efficiency.

What is claimed is:

1. A flexible electromagnetic shielding sheet comprising:
a pressure-sensitive adhesive tape composed of a fiber-accumulating type substrate, a first electrically conductive adhesive layer formed on one surface of the fiber-accumulating type substrate and a second electrically conductive adhesive layer formed on the other surface of the fiber-accumulating type substrate, wherein the fiber-accumulating type substrate is formed of accumulated polymer fibers and pores formed between the accumulated polymer fibers, and a metal coating layer is formed on outer circumferential surfaces of polymer fibers of the accumulated polymer fibers;

wherein the first electrically conductive adhesive layer and the second electrically conductive adhesive layer are formed of an adhesive material and electrically conductive fillers dispersed in the adhesive material, and filled in the pores of the fiber-accumulating type substrate; and wherein the electrically conductive fillers are configured to be electrically connected to each other by an applied pressure and electrically connect the first electrically conductive adhesive layer and the second electrically conductive adhesive layer to each other by the applied pressure;

a fiber web adhered to one of the first electrically conductive adhesive layer and the second electrically conductive adhesive layer, and formed of accumulated fibers;

a metal layer formed on the fiber web to shield electromagnetic waves; and an insulation film adhered to the fiber web on which the metal layer is formed.

2. The flexible electromagnetic shielding sheet of claim 1, wherein the fiber web is a non-porous structure or a microporous structure.

3. The flexible electromagnetic shielding sheet of claim 2, wherein the metal layer includes an ultra-thin film metal layer formed on the micropore structure, or the metal layer includes an ultra-thin film metal layer formed of a coated metal on outer circumferential surfaces of fibers located at inner side walls of micropores of the micropore structure.

4. The flexible electromagnetic shielding sheet of claim 1, wherein the metal layer is formed on one or both sides of the fiber web.

5. The flexible electromagnetic shielding sheet of claim 1, wherein the insulation film is a flexible insulating film, or a nanofiber web sheet formed of accumulated nanofibers.

6. The flexible electromagnetic shielding sheet of claim 1, wherein the first electrically conductive adhesive layer, the second electrically conductive adhesive layer and the metal layer are grounded.

7. The flexible electromagnetic shielding sheet of claim 1, wherein the accumulated polymer fibers is formed of nanofibers having a diameter of 1 μm or less, or the accumulated polymer fibers is formed of nonwoven fibers having a diameter of more than 1 μm.

8. The flexible electromagnetic shielding sheet of claim 1, wherein the accumulated polymer fibers includes a nanofiber web composed of electro-spun nanofibers having a diameter of 1 μm or less, wherein the nanofiber web is laminated on or bonded to one surface or both surfaces of a nonwoven fabric web made of fibers having a diameter of more than 1 μm.

9. The flexible electromagnetic shielding sheet of claim 1, wherein the accumulated fibers have a diameter of 100 nm to 5 μm.

10. The flexible electromagnetic shielding sheet of claim 1, wherein the metal coating layer comprises:
   a first metal coating layer of Ni; and
   a second metal coating layer of Cu coated on the first metal coating layer.

11. The flexible electromagnetic shielding sheet of claim 1, wherein the pressure-sensitive adhesive tape has a thickness of 30 μm or less.

12. An electronic device comprising:
   a printed circuit board;
   an electromagnetic wave generating unit mounted on the printed circuit board; and
   a flexible electromagnetic shielding sheet according to claim 1 which surrounds the electromagnetic wave generating unit and is coupled to or bonded to the printed circuit board to shield electromagnetic waves generated from the electromagnetic wave generating unit and electromagnetic waves flowing into the electromagnetic wave generating unit from outside.

13. The electronic device of claim 12, wherein the first electrically conductive adhesive layer, the second electrically adhesive layer and the metal layer are grounded.

* * * * *